US008804976B2

(12) United States Patent
Tsunoo et al.

(10) Patent No.: US 8,804,976 B2
(45) Date of Patent: Aug. 12, 2014

(54) CONTENT REPRODUCTION DEVICE AND METHOD, AND PROGRAM

(75) Inventors: Emiru Tsunoo, Tokyo (JP); Kyosuke Matsumoto, Tokyo (JP); Akira Inoue, Tokyo (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 13/325,868

(22) Filed: Dec. 14, 2011

(65) Prior Publication Data

US 2012/0155658 A1 Jun. 21, 2012

(30) Foreign Application Priority Data

Dec. 21, 2010 (JP) ................................ P2010-284367

(51) Int. Cl.
*H03G 3/20* (2006.01)

(52) U.S. Cl.
USPC ............. 381/57; 381/56; 381/94.1; 381/94.7; 381/101; 381/102; 381/104; 381/107

(58) Field of Classification Search
USPC .................... 381/57, 56, 94.1–94.3, 94.7, 98, 381/101–104, 106–107, 320–321
See application file for complete search history.

(56) References Cited

U.S. PATENT DOCUMENTS

2010/0246849 A1* 9/2010 Sudo et al. .................. 381/94.1

FOREIGN PATENT DOCUMENTS

JP 2005-295175 10/2005
JP 2009-8836 1/2009

* cited by examiner

*Primary Examiner* — Vivian Chin
*Assistant Examiner* — Paul Kim
(74) *Attorney, Agent, or Firm* — Sony Corporation

(57) ABSTRACT

A content reproduction device including: a microphone that collects noise in the surroundings of a casing; a feature amount extractor that extracts a plurality of feature amounts; a distance calculator that calculates an intervector distance between the extracted feature amount vector and a feature amount vector with the same dimensions which is set in advance as a feature amount of a waveform of a music signal; a determinator that determines whether or not music is included in the sounds collected by the microphone; a processor that processes the signal of the sounds collected by the microphone to change the volume or frequency characteristics of the sounds collected by the microphone; and an adder that adds and outputs the signal of the sounds collected by the microphone and the signal of sounds of reproduced content.

10 Claims, 16 Drawing Sheets

CONTENT REPRODUCTION DEVICE AND METHOD, AND PROGRAM

BACKGROUND

The present disclosure relates to a content reproduction device and method, and a program, and particularly relates to a content reproduction device and method, and a program in which it is possible to listen to music in comfort while being able to be attentive to sounds of the surroundings at all times.

Techniques of categorizing an audio signal into music or voices have been researched in the related art.

For example, in a case when the volume of voices or background noise that is superimposed is great as compared to music or the like, it is difficult to categorize whether an audio signal is music or voices. Accordingly, as a technique for music segment detection, a technique of calculating a music information evaluation value that represents whether or not each frame includes music by calculating an audio feature vector sequence for every short frame time period from the input audio signal and determining the music start and end times or the like has been proposed (for example, Japanese Unexamined Patent Application Publication No. 2009-8836).

Further, a technique of controlling the gain of a variable gain amplifier based on the received sound level that is detected by a received sound level detector and an external sound level that is detected by an external sound detector in order to provide headphones that are also able to receive sounds of the surroundings accurately while receiving the audio signal source that is the target or the like has also been proposed (for example, Japanese Unexamined Patent Application Publication No. 2005-295175).

SUMMARY

However, in a case when a user is listening to music with headphones, for example, when music is being played as surrounding sounds, if the surrounding sounds are made to be audible inside the headphones, it is perceived to be extremely annoying.

It is desirable to be able to listen to music in comfort while being able to be attentive to sounds of the surroundings at all times.

According to an embodiment of the disclosure, there is provided a content reproduction device including: a microphone that collects noise in the surroundings of a casing; a feature amount extractor that extracts a plurality of feature amounts that are obtained from the waveform of the signal of sounds collected by the microphone as a feature amount vector; a distance calculator that calculates an intervector distance between the extracted feature amount vector and a feature amount vector with the same dimensions which is set in advance as a feature amount of the waveform of a music signal; a determinator that determines whether or not music is included in the sounds collected by the microphone by determining a threshold value of the calculated distance; a processor that processes the signal of the sounds collected by the microphone to change the volume or frequency characteristics of the sounds collected by the microphone in a case when it is determined by the determinator that music is included in the sounds collected by the microphone; and an adder that adds and outputs the signal of sounds collected by the microphone and the signal of sounds of reproduced content.

The feature amount extractor may separate the waveform of the signal of sounds collected by the microphone into frames with predetermined lengths in terms of time, the determinator further determines whether or not music is included in the sounds collected by the microphone in the plurality of frames that are set in advance, and the processor processes the signal of sounds collected by the microphone in a case when it is determined by the determinator that music is included in the sounds collected by the microphone in the plurality of frames that are set in advance.

A rhythm detector that detects the rhythm of sounds collected by the microphone may be further included, wherein the detector may weight the calculated intervector distance based on the detection result of the rhythm detector.

Another processor that may process the signal of sounds of reproduced content to change the volume or frequency characteristics of sounds of the reproduced content in a case when it is determined by the determinator that music is included in the sounds collected by the microphone.

The rhythm detector may detect the peak of the waveform of the signal of the sounds collected by the microphone, may calculate the fit between the position of the detected peak in terms of time and the position of a beat in terms of time in a beat interval that is set in advance and determine whether or not the beat and the peak match, and may retain the number of beats that match the peak within a unit time.

The rhythm detector may determine whether or not the beat and the peak match within a predetermined amount of time that is shorter than the unit time and may update the beat interval based on the determination result.

A weighting controller that sets and multiplies a weighting coefficient according to the number of beats that match the peak for each unit time by the intervector distance that is calculated by the distance calculator may be included.

While it is determined by the determinator that music is included in the sounds collected by the microphone until it is determined that music is not included, the weighting controller may change the value of a weighting coefficient according to the number of beats.

According to another embodiment of the disclosure, there is provided a content reproduction method including: a microphone collecting noise in the surroundings of a casing; extracting by a feature amount extractor a plurality of feature amounts that are obtained from the waveform of a signal of sounds collected by the microphone as a feature amount vector; calculating by a distance calculator an intervector distance between the extracted feature amount vector and a feature amount vector with the same dimensions which is set in advance as a feature amount of the waveform of a music signal; determining by a determinator whether or not music is included in the sounds collected by the microphone by determining a threshold value of the calculated distance; processing by a processor the signal of the sounds collected by the microphone to change the volume or frequency characteristics of the sounds collected by the microphone in a case when it is determined by the determinator that music is included in the sounds collected by the microphone; and adding and outputting by an adder the signal of the sounds collected by the microphone and the signal of the sounds of reproduced content.

According to still another embodiment of the disclosure, there is provided a program including causing a computer to function as a content reproduction device that includes: a microphone that collects noise in the surroundings of a casing; a feature amount extracting means for extracting a plurality of feature amounts that are obtained from the waveform of a signal of sounds collected by the microphone as a feature amount vector; a distance calculating means for calculating an intervector distance between the extracted feature amount vector and a feature amount vector with the same dimensions which is set in advance as a feature amount of the waveform of a music signal; a determination means for determining whether or not music is included in the sounds collected by the microphone by determining a threshold value of the calculated distance; a processing means for processing the signal of the sounds collected by the microphone to change the volume or frequency characteristics of the sounds collected by the microphone in a case when it is determined by the determinator that music is included in the sounds collected by the microphone; and an adding means for adding and outputting the signal of sounds collected by the microphone and the signal of sounds of reproduced content.

According to an embodiment of the disclosure, noise in the surroundings of a casing is collected, a plurality of feature amounts that are obtained from the waveform of a signal of sounds are collected by the microphone as a feature amount vector, an intervector distance between the extracted feature amount vector and a feature amount vector with the same dimensions which is set in advance as a feature amount of the waveform of a music signal is calculated, whether or not music is included in the sounds collected by the microphone is determined by determining a threshold value of the calculated distance; the signal of the sounds collected by the microphone is processed to change the volume or frequency characteristics of the sounds collected by the microphone in a case when it is determined by the determinator that music is included in the sounds collected by the microphone, and the signal of sounds collected by the microphone and the signal of sounds of reproduced content are added and output.

It is possible to listen to music comfortably while being able to be attentive to sounds of the surroundings at all times.

DETAILED DESCRIPTION OF EMBODIMENTS

Embodiments of the disclosure will be described below with reference to the drawings.

Figure 1:
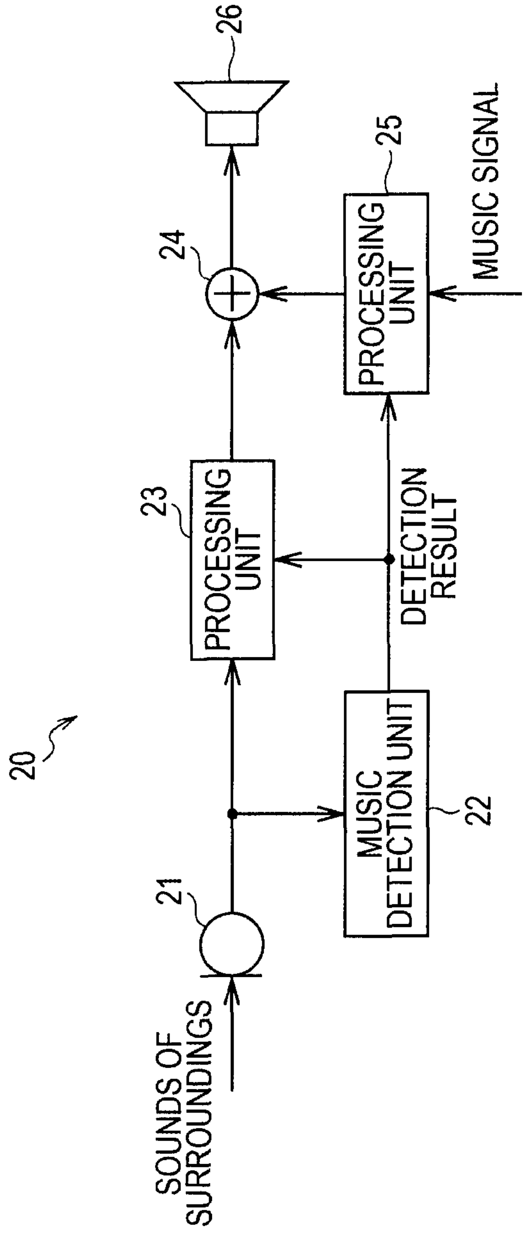
FIG. 1 is a block diagram that illustrates a configuration example according to an embodiment of a music reproduction device to which the disclosure is applied.

FIG. 1 is a block diagram that illustrates a configuration example of an embodiment of a music reproduction device 20 to which the embodiments of the disclosure are applied. The music reproduction device 20 may be configured, for example, as a so-called headphone stereo or may simply be configured as headphones. That is, the music reproduction device 20 described here does not necessarily integrally include a function of reproducing music content or the like, and may be configured, for example, as headphones that are connected to a digital audio player or the like.

The music reproduction device 20 that is illustrated in the drawing is configured by a microphone 21, a music detection unit 22, a processing unit 23, an adding machine 24, a processing unit 25, and a speaker 26.

The microphone 21 collects sounds of the surroundings and outputs a signal that corresponds to the collected sounds. Here, the sounds collected include, for example, the sound of a bicycle that passes along a road on which the user is walking, the voices of people in the surroundings of the user, music that is being played as background music in a shop or the like that the user visits, or the like.

The music detection unit 22 detects music from the sounds of the surroundings by determining whether or not music is included in a signal that is output from the microphone 21. Here, the detailed configuration of the music detection unit 22 will be described later.

The processing unit 23 processes a signal that is output from the microphone 21 based on the detection result of the music detection unit 22. The processing unit 23 may, for example, perform processing to adjust the volume of the signal that is output from the microphone 21 or may perform processing to adjust the frequency characteristics of the signal that is output from the microphone 21.

The processing unit 25 processes the signal of the content of music (music signal) that is reproduced by a reproduction unit (not shown) based on the detection result of the music detection unit 22. The processing unit 25 may, for example, perform processing to adjust the volume of the music signal or may perform processing to adjust the frequency characteristics of the music signal.

Here, the processing unit 25 may not be provided.

The adding machine 24 adds the signal that is output from the processing unit 23 and the signal that is output from the processing unit 25 and outputs the added signals to the speaker 26.

The speaker 26 outputs sounds that correspond to the input signal, and such sounds become sounds that are audible to the ears of the user.

That is, with the music reproduction device 20, it is possible to hear the sounds of the surroundings as necessary in addition to the reproduced music.

That is, for example, in a case when listening to music with headphones, since the sounds of the surroundings are not easy to hear, the sounds of the surroundings are heard by being superimposed over the music. In so doing, it is hoped that safety is improved by being able to notice a person calling or being able to hear the sounds of moving cars.

However, in a case when music is being played in the surroundings, if such music is superimposed, the superimposed music competes with the music of the content that is being reproduced. Accordingly, the music is detected by the music detection unit 22 and processing such as performing filter processing to change the volume or to change the frequency characteristics or the like is performed by the processing unit 23 or the processing unit 25.

Figure 2:
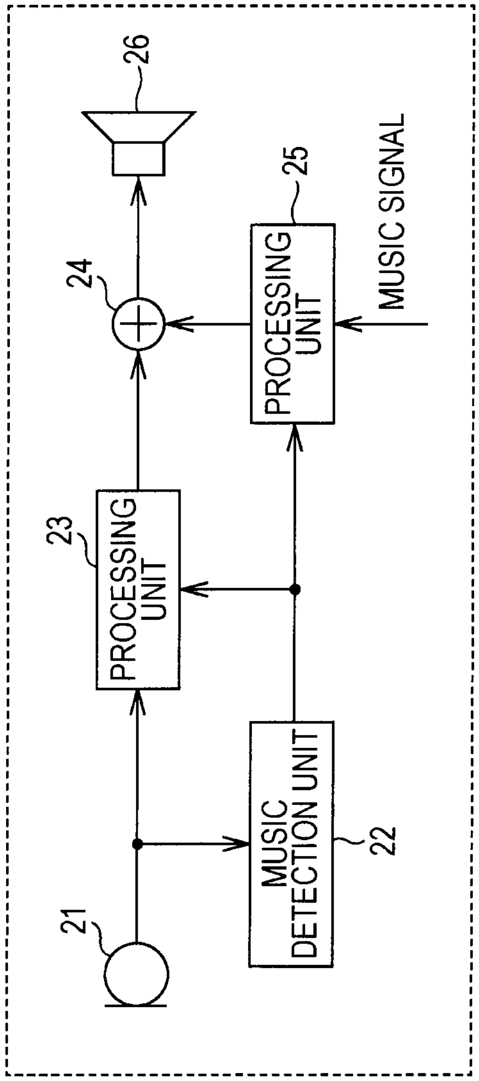
FIG. 2 is a block diagram that illustrates another configuration example according to an embodiment of the music reproduction device to which the disclosure is applied.
Figure 3:
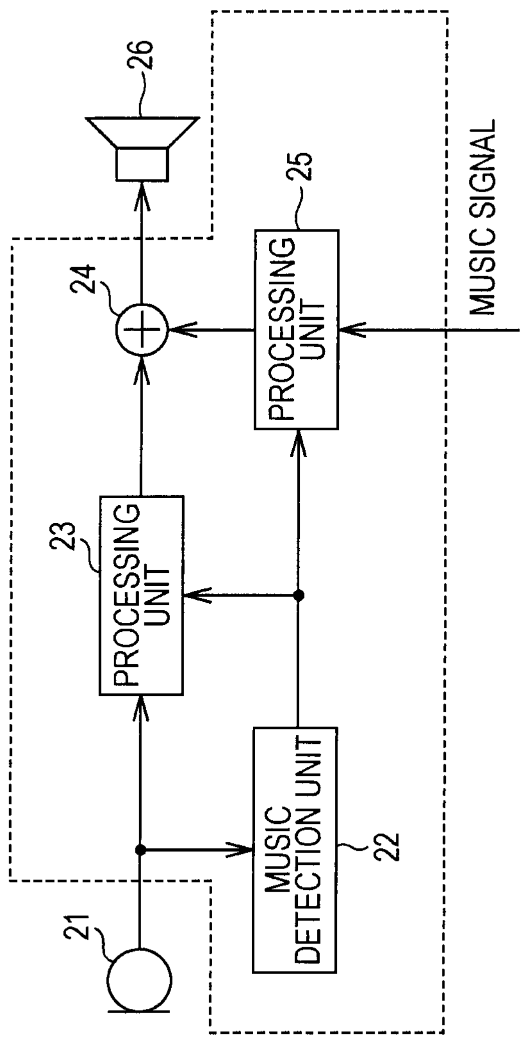
FIG. 3 is a block diagram that illustrates another configuration example according to an embodiment of the music reproduction device to which the disclosure is applied.

As illustrated in FIG. 2, the music detection unit 22 to the processing unit 25 may be provided on the inside of a casing such as headphones which is illustrated by the dotted line in the drawing. Alternatively, as illustrated in FIG. 3, the music detection unit 22 to the processing unit 25 may be provided on the outside of a casing such as a digital audio player which is illustrated by the dotted line in the drawing.

Figure 4:
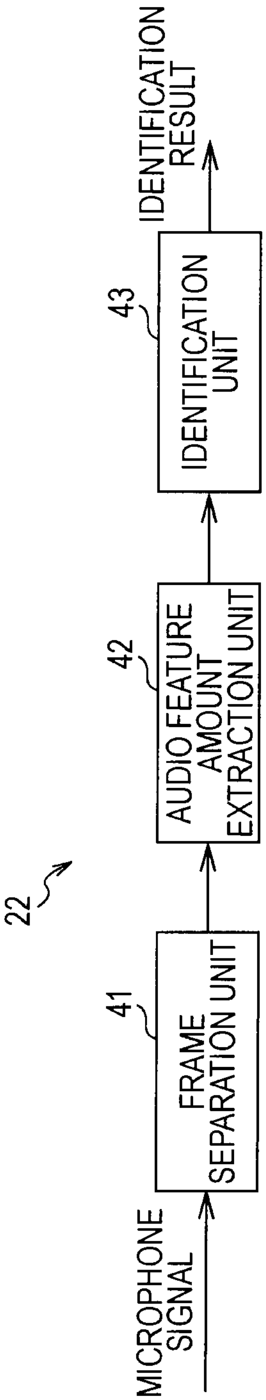
FIG. 4 is a block diagram that illustrates a detailed configuration example of a music detection unit.

FIG. 4 is a block diagram that illustrated a detailed configuration example of the music detection unit 22. As illustrated in the drawing, the music detection unit 22 is configured by a frame separation unit 41, an audio feature amount extraction unit 42, and an identification unit 43.

The frame separation unit 41 separates an input signal into a plurality of frames with predetermined lengths in terms of time by multiplying the input signal with a short time window function. Furthermore, frequency analysis is performed by performing Fourier transform on each of frames that are separated from the signal.

Here, a short time window function is able to be set such that a portion of the times overlap, and, for example, a window function such as a Hamming window, a Hann window, and a Blackman window is used.

The audio feature amount extraction unit 42 extracts several types of extraction amounts, for example, before and after the Fourier transform is performed by the frame separation unit 41.

Figure 5:
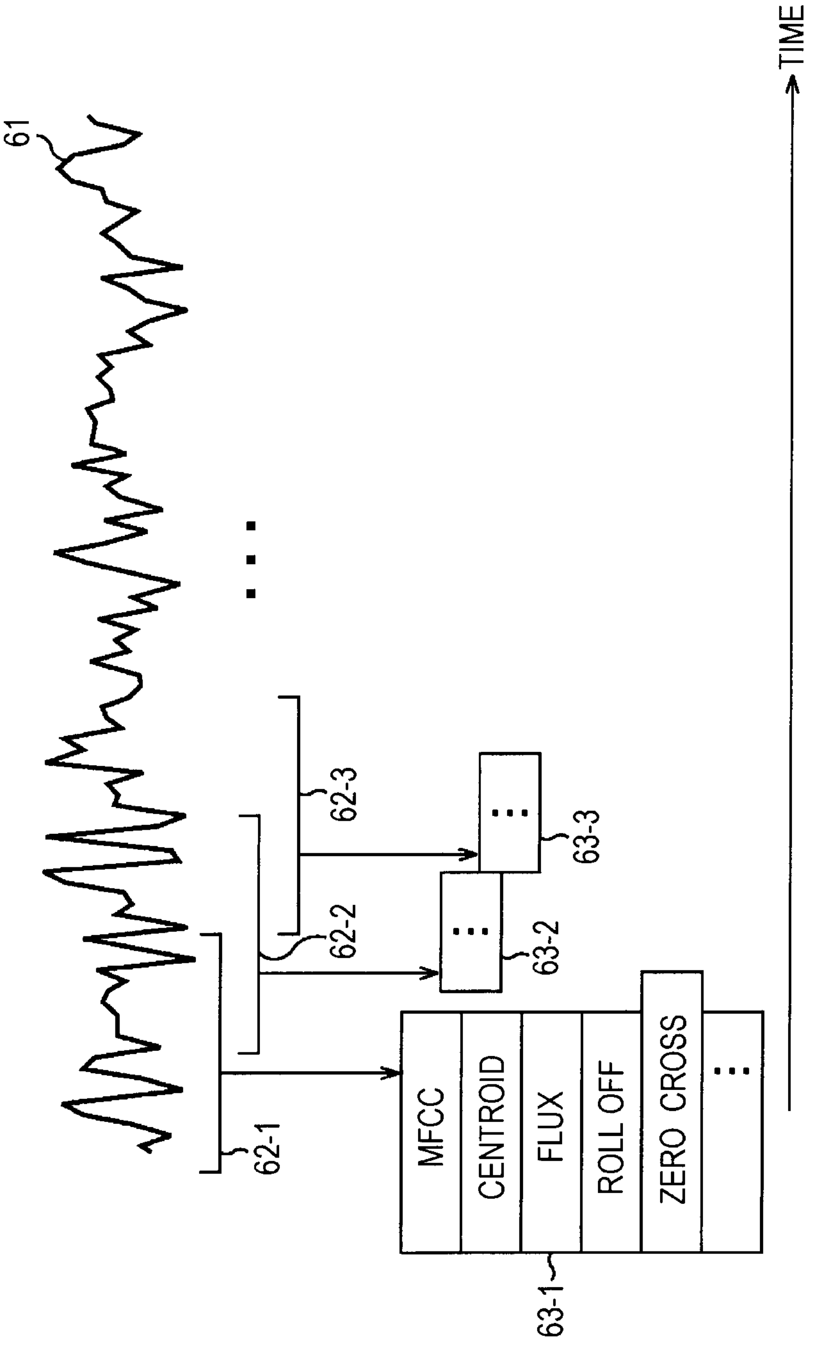
FIG. 5 is a diagram that describes the processes of a frame separation unit and an audio feature amount extraction unit of FIG. 4.

Further description will be given with reference to FIG. 5. FIG. 5 is a diagram that describes an example of the processes of the frame separation unit 41 and the audio feature amount extraction unit 42. A waveform 61 that is illustrated at the top of the drawings represents the waveform of the signal of the sounds collected by the microphone 21 of FIGS. 1 to 3.

The frame separation unit 41 separates the waveform 61 into a frame 62-1, a frame 62-2, a frame 62-3, . . . that are frames of predetermined lengths in terms of time.

The audio feature amount extraction unit 42 extracts several types of feature amounts with small dimensions, for example, before and after the Fourier transform is performed by the frame separation unit 41.

For example, feature amounts such as zero cross before the Fourier transform and Mel-frequency cepstral coefficients (MFCC), spectrum centroid, spectrum flux, roll off, and the like after the Fourier transform are extracted.

In the example of FIG. 5, a feature amount group 63-1 is extracted from a waveform that is included in the frame 62-1. Similarly, feature amount groups are extracted by a feature amount group 63-2 being extracted from a waveform that is included in the frame 62-2, a feature amount group 63-3 being extracted from a waveform that is included in the frame 62-3.

The feature amount group 63-1, the feature amount group 63-2, the feature amount group 63-3, . . . are respectively supplied to the identification unit 43 as feature amounts of each frame.

The identification unit 43 learns the feature amounts of music signals by, for example, general supervised learning with labels for correct answers using a plurality of feature amount vectors that are extracted from music signals in advance. For example, learning using a Gaussian mixture model, a kNN classifier, a support vector machine, or the like is performed.

From such learning, a typical feature amount vector that is a feature amount vector with the same dimensions as, for example, the feature amount group 63-1, the feature amount group 63-2, the feature amount group 63-3, . . . and which corresponds to a music signal is obtained. The typical feature amount vector may obtain, for example, a plurality of feature amount vectors such as a feature amount vector that corresponds to a signal of ballade music, a feature amount vector that corresponds to a signal of rock music, . . . .

The identification unit 43 calculates the distance between the feature amount vectors of each frame and the typical feature amount vector described above, compares the calculated intervector distance with a threshold value, and in a case when the intervector distance is equal to or less than the threshold value, turns ON an identification flag that is associated with the frame. Here, in a case when there is a plurality of typical feature amount vectors, the distances between the feature amount vectors of each frame and the plurality of typical feature amount vectors are calculated, and in a case when any of the distances is equal to or less than the threshold value, turns ON an identification flag that is associated with such a frame.

Furthermore, the identification unit 43 determines, for example, in a case when identification flags for the past 10 frames are ON, that the current frame is a frame of a music signal.

Here, the method of determination described above is an example, and whether or not a frame is of a music signal may be determined by other methods.

In such a manner, the music within the sounds collected by the microphone 21 is detected.

Furthermore, in a case when music is detected by the music detection unit 22, the processing unit 23 performs processing such as lowering the volume of a signal that is output from the microphone 21, changing the frequency characteristics by removing a signal of predetermined frequency bands from a signal that is output from the microphone 21, or the like.

In so doing, in addition to being able to improve safety by being able to notice a person calling or being able to hear a moving car, for example, annoyance is avoided even when music is being played in the surroundings of the user.

Figure 6:
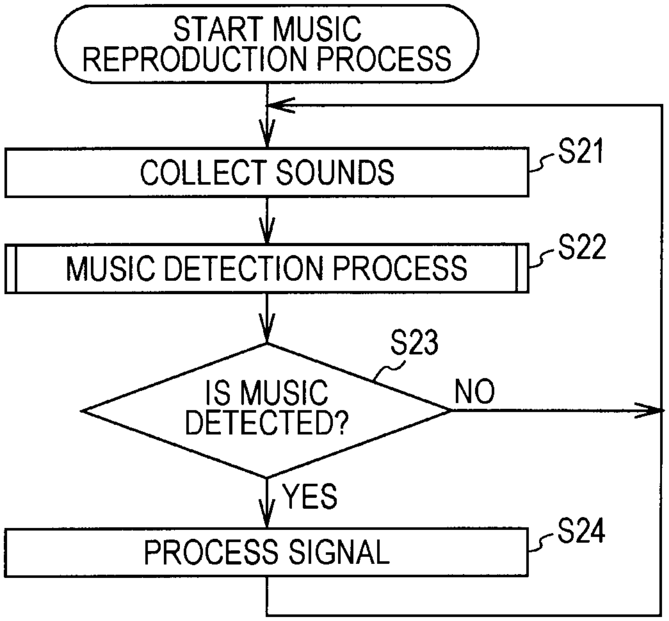
FIG. 6 is a flowchart that describes an example of a music reproduction process.

Next, an example of a music reproduction process by the music reproduction device 20 of FIG. 1 will be described with reference to the flowchart of FIG. 6.

In step S21, the microphone 21 collects the sounds of the surroundings. Here, a signal of the collected sounds is output to the music detection unit 22 and the processing unit 23.

In step S22, the music detection unit 22 executes a music detection process that will be described later with reference to FIG. 7.

In step S23, the processing unit 23 or the processing unit 25 determines whether or not music is detected.

In a case when it is determined in step S23 that music is detected, the processing proceeds to step S24, and the processing unit 23 or the processing unit 25 processes the input signal. At this time, filter processing or the like that lowers (or increases) the volume or causes the frequency characteristics to be specialized, for example, is performed. That is, the volume, the frequency characteristics, or the like of the sounds that correspond to the signal that is output from the processing unit 23 or the processing unit 25 is set to a special value that is different from an ordinary value.

In short, in a case when music is included in the sounds collected by the microphone 21, processing to cause the music of the content to be easier to listen is performed by the processing unit 23 or the processing unit 25.

On the other hand, in a case when it is determined that music is not detected in step S23, the process of step S24 is skipped. That is, the processing unit 23 or the processing unit 25 performs processing of the input signal and outputs as is.

Here, the signal that is output from the processing unit 23 is added to the music signal and output by the adding machine 24.

The music reproduction process is executed in such a manner.

Next, a detailed example of the music detection process of step S22 of FIG. 6 will be described with reference to FIG. 7.

In step S41, the frame separation unit 41 separates the input signal into a plurality of frames with predetermined lengths in terms of time by multiplying a short time window function with the input signal. Furthermore, frequency analysis is performed by performing Fourier transform for each of the frames that are separated from the signal.

In step S42, along with the process of step S41, several types of feature amounts are extracted before and after the Fourier transform is performed by the frame separation unit 41. At this time, as described above, feature amounts such as, for example, zero cross and Mel-frequency cepstral coefficients (MFCC), spectrum centroid, spectrum flux, roll off, and the like after the Fourier transform are extracted.

In step S43, the audio feature amount extraction unit 42 calculates the distance between a feature amount vector that is composed of the feature amounts that are extracted in step S42 and a typical feature amount vector that corresponds to a music signal that is learned in advance.

In step S44, the identification unit 43 determines whether or not the intervector distance calculated in step S43 is equal to or less than the threshold value. In a case when it is determined in step S44 that the calculated intervector distance is equal to or less than the threshold, the processing proceeds to step S45.

In step S45, the identification unit 43 turns ON an identification flag that is associated with the frame.

In step S46, the identification 43 determines whether or not identification flags, for example, for a predetermined number of frames in the past (for example, 10 frames) are ON.

In a case when it is determined in step S46 that the identification flags for a predetermined number of frames in the past are ON, the processing proceeds to step S47 and the identification unit 43 outputs a music detection signal as an identification result. In so doing, the processing unit 23 or the processing unit 25 is notified that music has been detected.

On the other hand, in a case when it is determined in step S46 that the identification flags for a predetermined number of frames in the past are OFF, the processing of step S47 is skipped.

Further, in a case when it is determined in step S44 that the calculated intervector distance is not equal to or less than the threshold value, the processing of steps S45 to step S47 are skipped.

The music detection process is executed in such a manner.

Incidentally, in the example described above with reference to FIG. 4, music is detected based on the result of comparing the intervector distance of feature amount vectors. However, with such a method, there is a case when music is not able to be detected stably.

For example, in a case when the detection result of the music detection unit 22 changes and does not stabilize over a short amount of time, when there is much noise included in the sounds of the surroundings, or the like, there is a possibility of the detection result lacking precision.

Accordingly, the embodiments of the disclosure also propose a method of being able to detect music more stably and accurately.

Figure 8:
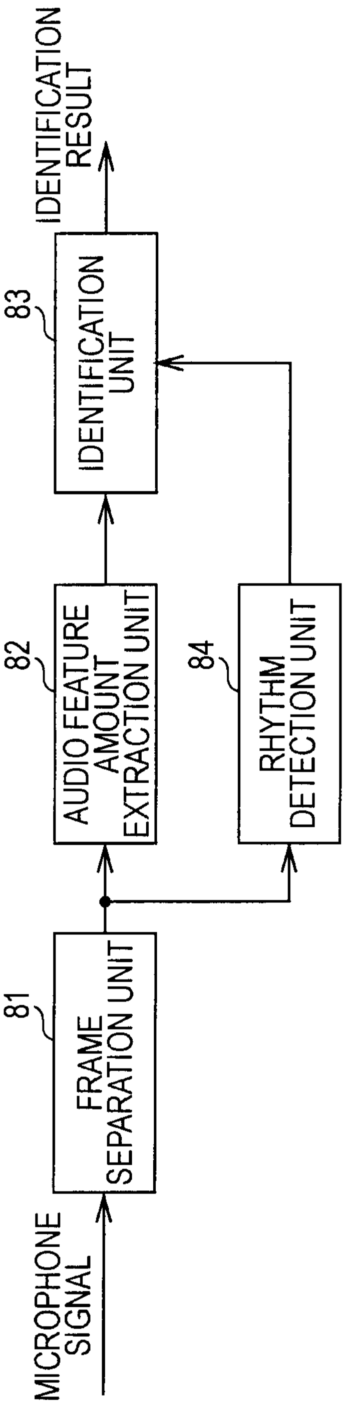
FIG. 8 is a block diagram that illustrates a different detailed configuration example of a music detection unit.

FIG. 8 is a block diagram that illustrates a different configuration example of the music detection unit 22 of FIG. 1. In FIG. 8, the music detection unit 22 is configured by a frame separation unit 81, an audio feature amount extraction unit 82, an identification unit 83, and a rhythm detection unit 84.

Since the frame separation unit 81, the audio feature amount extraction unit 82, and the identification unit 83 of FIG. 8 are respectively the same functional blocks as the frame separation unit 41, the audio feature amount extraction unit 42, and the identification unit 43 of FIG. 4, detailed description thereof will be omitted. In the example of FIG. 8, unlike with the case of FIG. 4, the rhythm detection unit 84 is provided.

The rhythm detection unit 84 detects a rhythm from the sounds collected from the microphone 21. Furthermore, music is able to be detected more stably and accurately by, for example, adjusting the weighting of the threshold value determination by the identification unit 83 based on the result of the detection of a rhythm by the rhythm detection unit 84.

Figure 9:
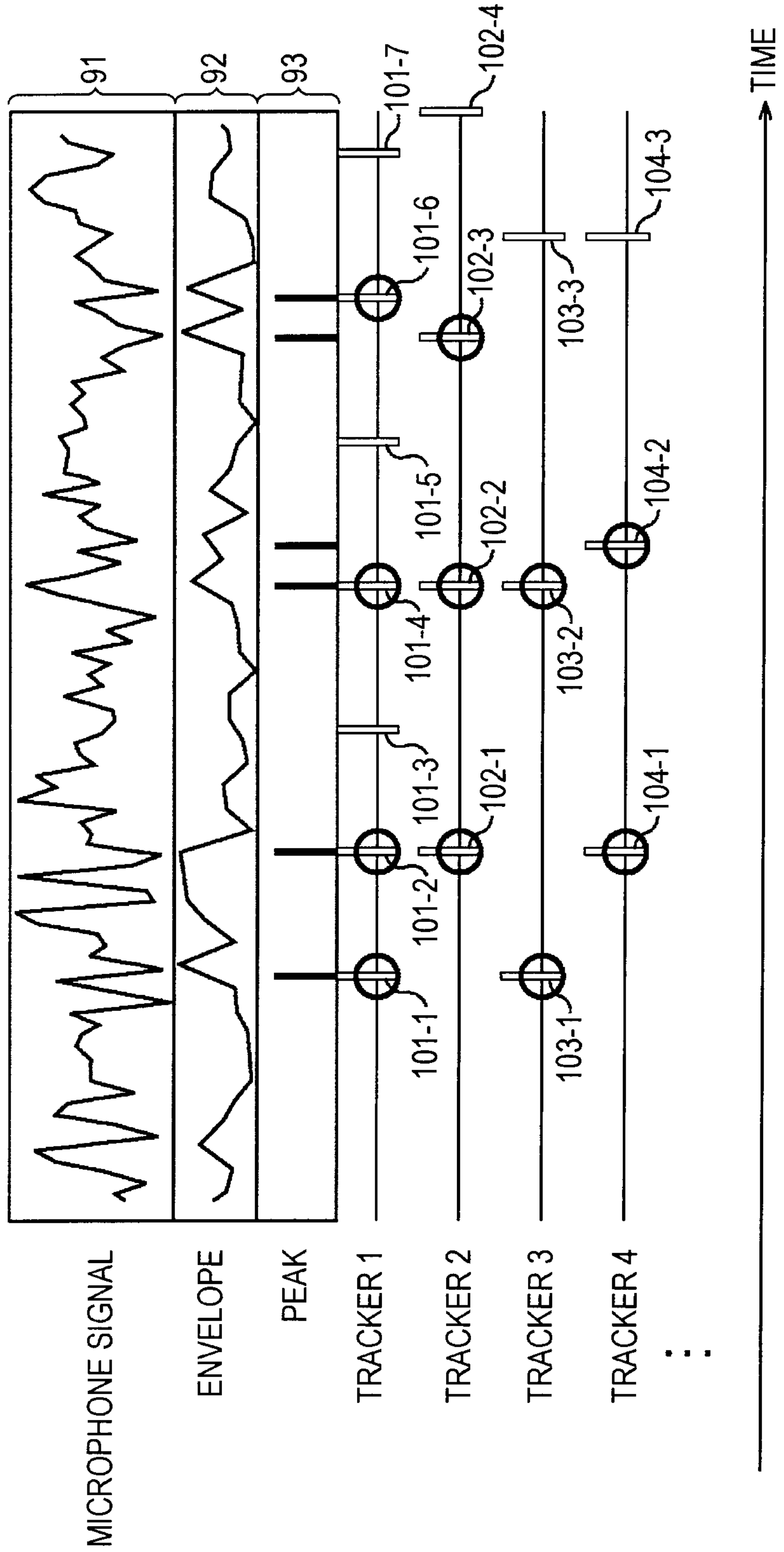
FIG. 9 is a diagram that describes the process of a rhythm detection unit.

FIG. 9 is a diagram for describing the processing of a rhythm detection unit. In the drawing, the horizontal axis is time, and a waveform for a plurality of frames that are separated by the frame separation unit 81 which is the waveform of the signal of the sounds collected by the microphone 21 is shown in a region 91.

An envelope of the waveform shown in the region 91 is shown in a region 92. The envelope is obtained by, for example, causing the signal of the waveform shown in the region 91, to be passed through a low-pass filter. By obtaining the envelope, it becomes easy to detect the peaks of the waveform.

The peaks of the waveform that is obtained based on the envelope are shown as bars that extend in the vertical direction in the drawing in a region 93. That is, the positions in the horizontal direction in the drawings of a plurality of bars that are shown in the region 93 correspond to the positions in terms of time of the peaks.

The detection results by a tracker 1, a tracker 2, a tracker 3, a tracker 4, . . . are shown below the region 93 of FIG. 9.

The tracker 1, the tracker 2, the tracker 3, the tracker 4, are respective functional blocks that are provided on the rhythm detection unit 84 and set, for example, a beat interval according to the tempo. Here, in a case when there is no cause to individually distinguish the tracker 1, the tracker 2, the tracker 3, the tracker 4, . . . , such trackers are simply referred to as the tracker.

For example, a beat interval in which different tempos such as bpm (beats per minute)=100 for the tracker 1 and bpm (beats per minute)=50 for tracker 2, . . . is set in advance.

Each of the individual trackers calculates the fit between the set beat interval and the positions of the peaks shown in the region 93. In FIG. 9, the positions in the horizontal direction in the drawings which are illustrated by bars that extend in the vertical direction in the drawing on a line in the horizontal direction in the drawing which is shown to the right of the portions in which tracker 1, tracker 2, tracker 3, and tracker 4 are written are the positions of the beats that are set by the individual trackers.

The tracker 1 sets, for example, a beat interval that corresponds to the positions shown by a bar 101-1 to a bar 101-7. The tracker 1 calculates the fit (peak fit) between the positions of the beats (beat positions) and the positions of the peaks (peak positions) based on the difference in terms of time between the bar 101-1 and the positions of the peaks shown in the region 93. For example, in a case when the peak fits exceeds the threshold value, it is determined that the beats and the peaks set by the tracker 1 match. In the example of FIG. 9, circles are added to the beats that match the peaks, and for example, the beats and the peaks match at the bar 101-1, the bar 101-2, the bar 101-4, and the bar 101-6 of the tracker 1.

Furthermore, the tracker 1 counts and retains the number of beats that match the peaks over a unit time, for example. If the time shown in FIG. 9 is the unit time, in the case of the tracker 1, 4 beats match the peaks.

Here, for example, in a case when beats that match the peaks are not detected within a predetermined amount of time that is shorter than the unit time, the tempo of the tracker 1 is changed and updating of the beat interval is performed. For example, a tempo that was bpm=100 is changed to bpm=105 and a beat interval is newly set. Alternatively, updating of the beat interval may be performed by the melody of the tracker 1 changing. For example, in a case when the beat interval that was set by the tracker 1 as an initial value was a short beat interval with a rock melody, a long beat interval may be newly set by changing the tune to bossa nova.

Similar processes are also performed on the tracker 2, the tracker 3, the tracker 4, . . . . In so doing, individual trackers respectively retain the number of beats that match the peaks (beat number) in the beat intervals that the trackers set themselves.

The rhythm detection unit 84 selects, for example, out of the beat numbers of the individual trackers, the greatest beat number, and supplies the beat number to the identification unit 83. In such a case, the identification unit 83 determines the threshold value, for example, by multiplying a weighting coefficient that corresponds to the beat number by the intervector distance of the feature amount vectors described above.

Figure 10:
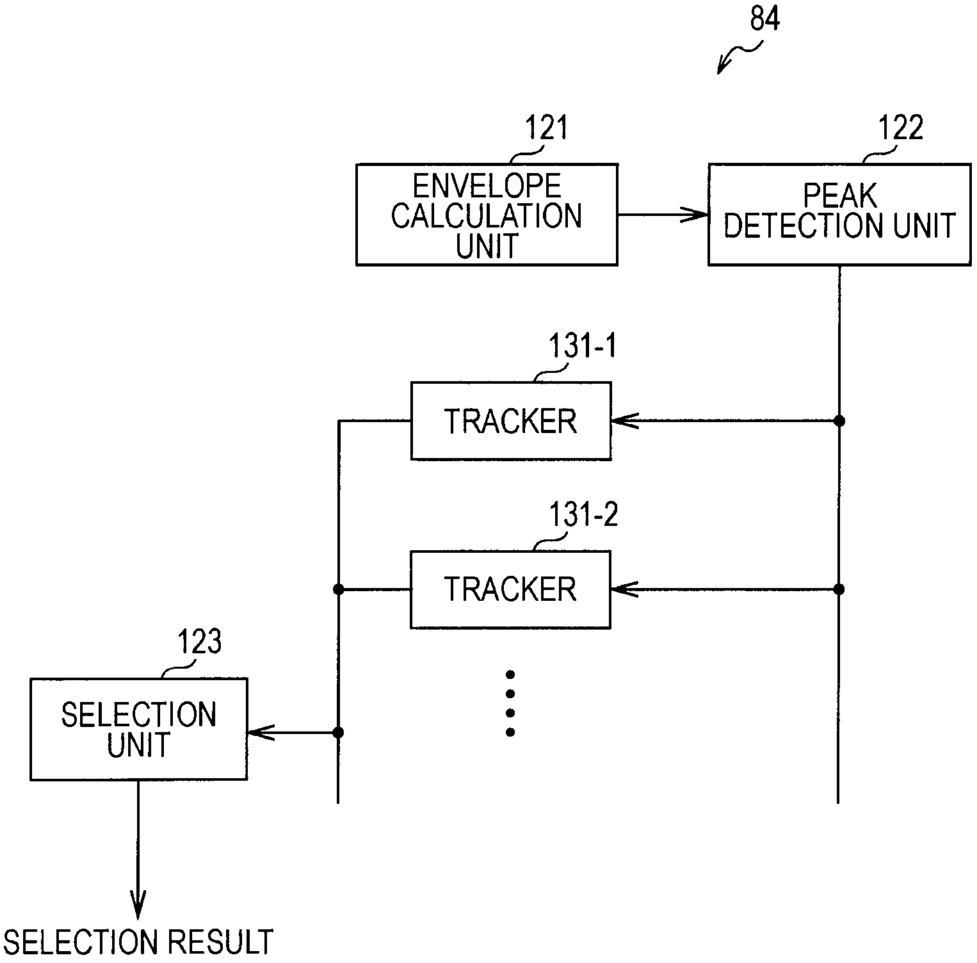
FIG. 10 is a block diagram that illustrates a detailed configuration example of the rhythm detection unit.

FIG. 10 is a block diagram that illustrates a detailed configuration example of the rhythm detection unit 84. As illustrated in the drawing, the rhythm detection unit 84 is configured by an envelope calculation unit 121, a peak detection unit 122, a selection unit 123, a tracker 131-1, a tracker 131-2, . . . . Here, the tracker 131-1, the tracker 131-2, . . . of FIG. 10 correspond to the tracker 1, the tracker 2, . . . of FIG. 9.

The envelope calculation unit 121 calculates an envelope based on the waveform of a frame separated signal that is output from the frame separation unit 81. Accordingly, the envelope as shown in the region 92 of FIG. 9, for example, is obtained.

The peak detection unit 122 detects the peaks of the waveform based on the envelope that is calculated by the envelope calculation unit 121. Accordingly, the peak positions as shown in the region 93 of FIG. 9, for example, are obtained. The detection results of the peak detection unit 122 are supplied to the tracker 131-1, the tracker 131-2, . . . .

The selection unit 123 selects the greatest out of the beat numbers that the tracker 131-1, the tracker 131-2, . . . retain.

Figure 11:
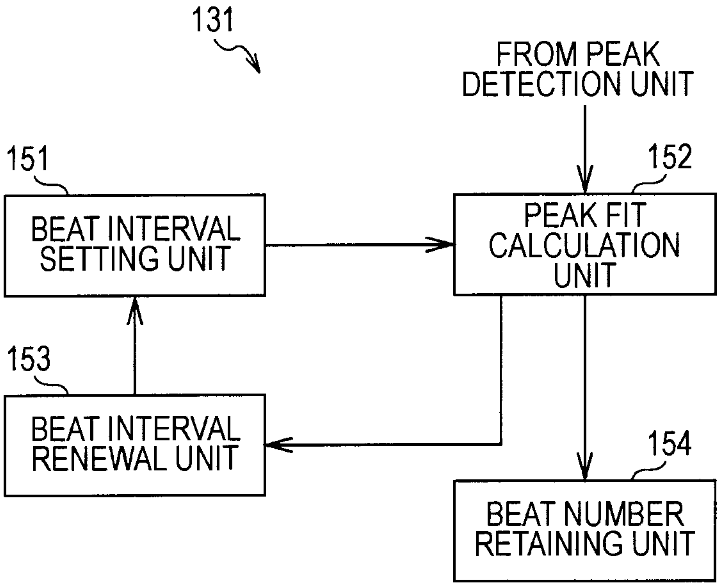
FIG. 11 is a block diagram that illustrates a detailed configuration example of a tracker.

FIG. 11 is a block diagram that illustrates a detailed configuration example of the tracker 131 of FIG. 10. Here, since the tracker 131-1, the tracker 131-2, . . . of FIG. 10 are respectively configured similarly, here, such trackers are collectively referred to as the tracker 131.

As illustrated in FIG. 11, the tracker 131 is configured by a beat interval setting unit 151, a peak fit calculation unit 152, a beat interval update unit 153, and a beat number retaining unit 154.

The beat interval setting unit 151 sets the beat interval, for example, like the bar 101-1, the bar 101-2, . . . described above with reference to FIG. 9.

The peak fit calculation unit 152 calculates the peak fit based on the difference in terms of time between the beat positions and the peak position as described above with reference to FIG. 9, for example.

The beat interval update unit 153 newly sets (updates) the beat interval by changing the tempo, the melody, or the like in a case when a beat that matches a peak is not detected within a predetermined amount of time, for example.

The beat number retaining unit 154 retains the beat number that is the number of beats that match the peaks within the unit time.

In such a manner, the beat number is retained and weighting is performed by a weighting coefficient that corresponds to the beat number being set.

Figure 12:
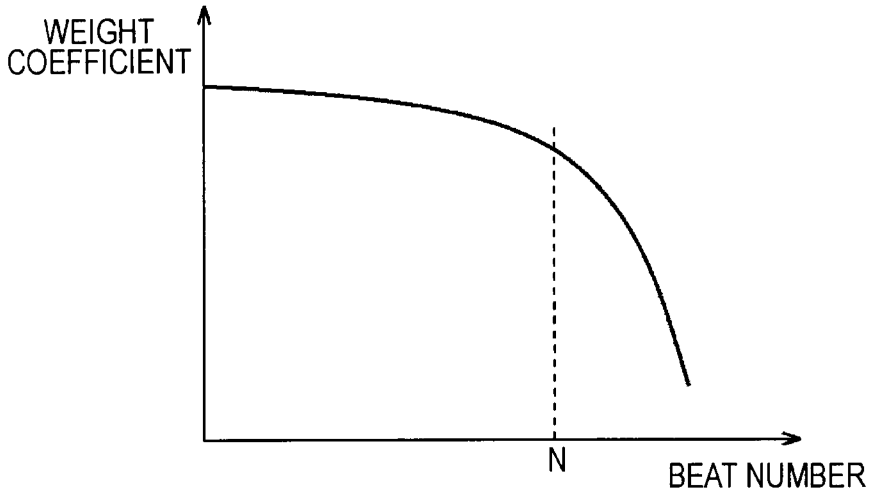
FIG. 12 is a diagram that describes a beat number and a weighting coefficient.
Figure 13:
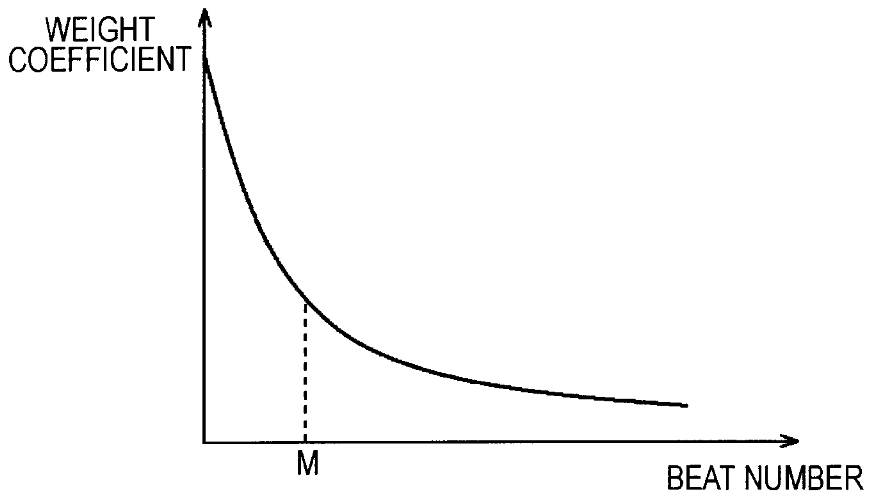
FIG. 13 is another diagram that describes a beat number and a weighting coefficient.

FIGS. 12 and 13 are diagrams that describe the beat number and the weighting coefficient.

FIG. 12 is a diagram that describes the relationship between the beat number and the weighting coefficient in a case when a music detection signal is not output from the music detection unit 22 (that is, in a case when music is not detected).

As illustrated in the drawing, as the beat number increases, the value of the weighting coefficient decreases. In particular, as the beat number exceeds N, the weighting decreases sharply. For example, when the identification unit 83 determines the threshold value in the process of step S44 of FIG. 7, if the intervector distance that is calculated in step S43 is multiplied by the weighting coefficient illustrated in FIG. 12, as the value of the beat number increases, the possibility of a music detection signal being output increases. However, in a case when the beat number is equal to or less than N, even if the value of the beat number increases, the possibility of a music detection signal being output does not increase much.

FIG. 13 is a diagram that describes the relationship between the beat number and the weighting coefficient in a case when a music detection signal is output from the music detection unit 22 (that is, in a case when music is detected).

As illustrated in the drawing, as the beat number increases, the value of the weighting coefficient decreases. In particular, the weighting decreases sharply between a beat number of 0 and M. For example, when the identification unit 83 determines the threshold value in the processing of step S44 of FIG. 6, if the intervector distance that is calculated in step S43 is multiplied by the weighting coefficient illustrated in FIG. 13, as the value of the beat number increases, the possibility of a music detection signal being output increases. However, in a case when the beat number exceeds M, even if the value of the beat number is small, the possibility of a music detection signal being output is strong.

That is, until music is detected, as long as a certain beat number is not detected, the weighting coefficient is set so that a music detection signal is not output, and after music is detected, unless the detected beat number is rather low, the weighting coefficient is set so that a music detection signal is output. In so doing, it is possible to detect music more accurately and stably.

In such a manner, by performing the processing of the identification unit 83 based on the detection result by the rhythm detection unit 84, it becomes possible to detect music more accurately and stably. The reason is that even in a case when loud noises are included in the sounds of the surroundings, for example, it is relatively easy to detect the beat positions of the music.

Figure 14:
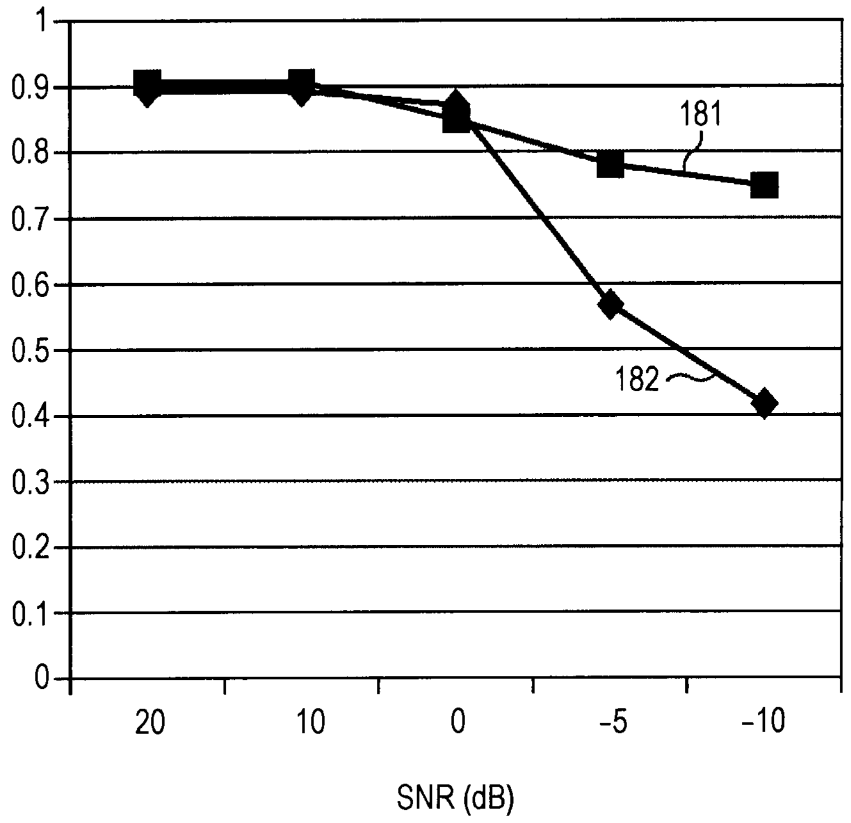
FIG. 14 is a diagram that describes an evaluation result in which the detection result of music by the music detection unit is evaluated by the F-measure.

FIG. 14 is a diagram that describes an evaluation result in which the detection result of the music by the music detection unit 22 is evaluated by the F-measure. The horizontal axis in the drawing represents the degree (SNR) of the size of the noise in the sounds of the surroundings, and the vertical axis in the drawing represents the F-measure. Further, a line 181 that is plotted by points with square markings in the drawing represents the detection result of the music detection unit 22 of the configuration illustrated in FIG. 8, and a line 182 that is plotted by points with diamond-shaped markings in the drawing represents the detection result of the music detection unit 22 of the configuration illustrated in FIG. 4.

As illustrated in FIG. 14, the line 182 falls sharply toward the right hand side in the drawing, and as the degree of noise in the sounds of the surroundings becomes greater, the F-measure decreases and the overall performance decreases. On the other hand, the line 181 falls gently toward the right hand side in the drawing, and even if the degree of noise in the sounds of the surroundings increases, the F-measure does not decrease much and the overall performance does not decrease.

That is, it is seen that if the music detection unit 22 of the configuration illustrated in FIG. 8 is used, even in a case when loud noises are included in the sounds of the surroundings, it is possible to detect music more accurately and stably.

Next, an example of the music detection process of step S22 of FIG. 6 in a case when the configuration of FIG. 8 is adopted will be described with reference to the flowchart of FIG. 15.

Figure 7:
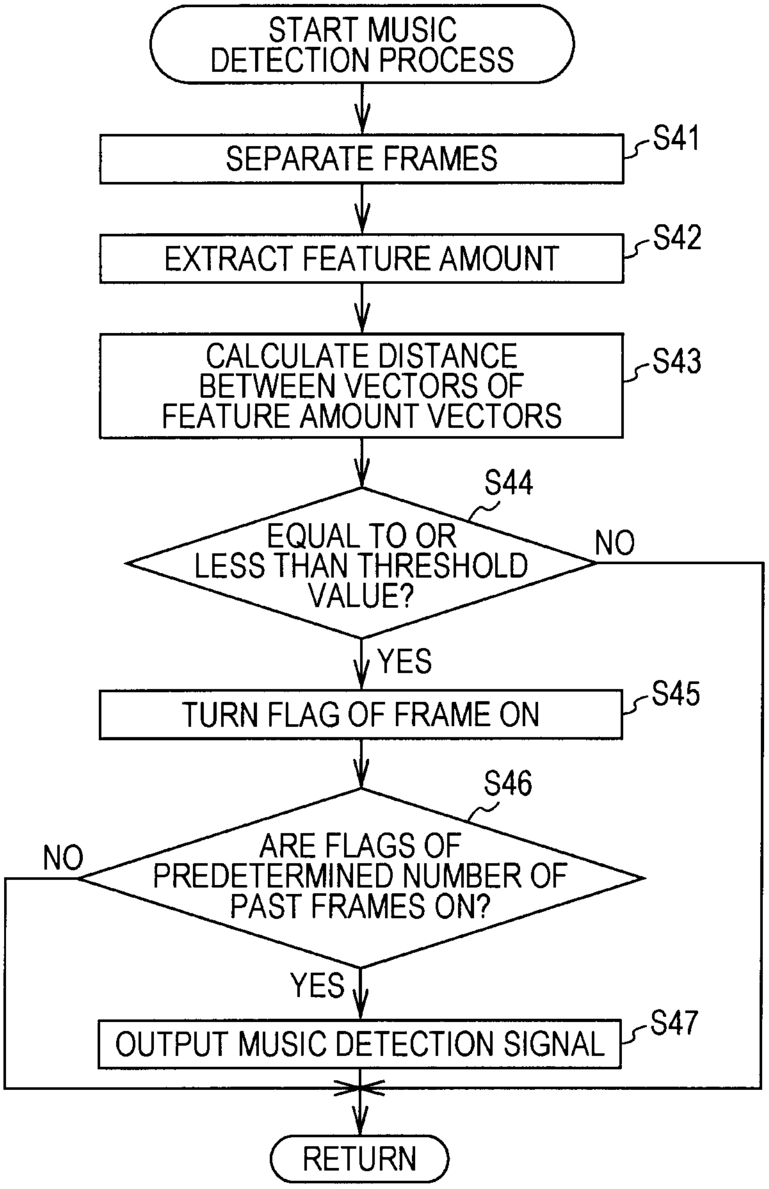
FIG. 7 is a flowchart that describes another example of a music reproduction process.
Figure 15:
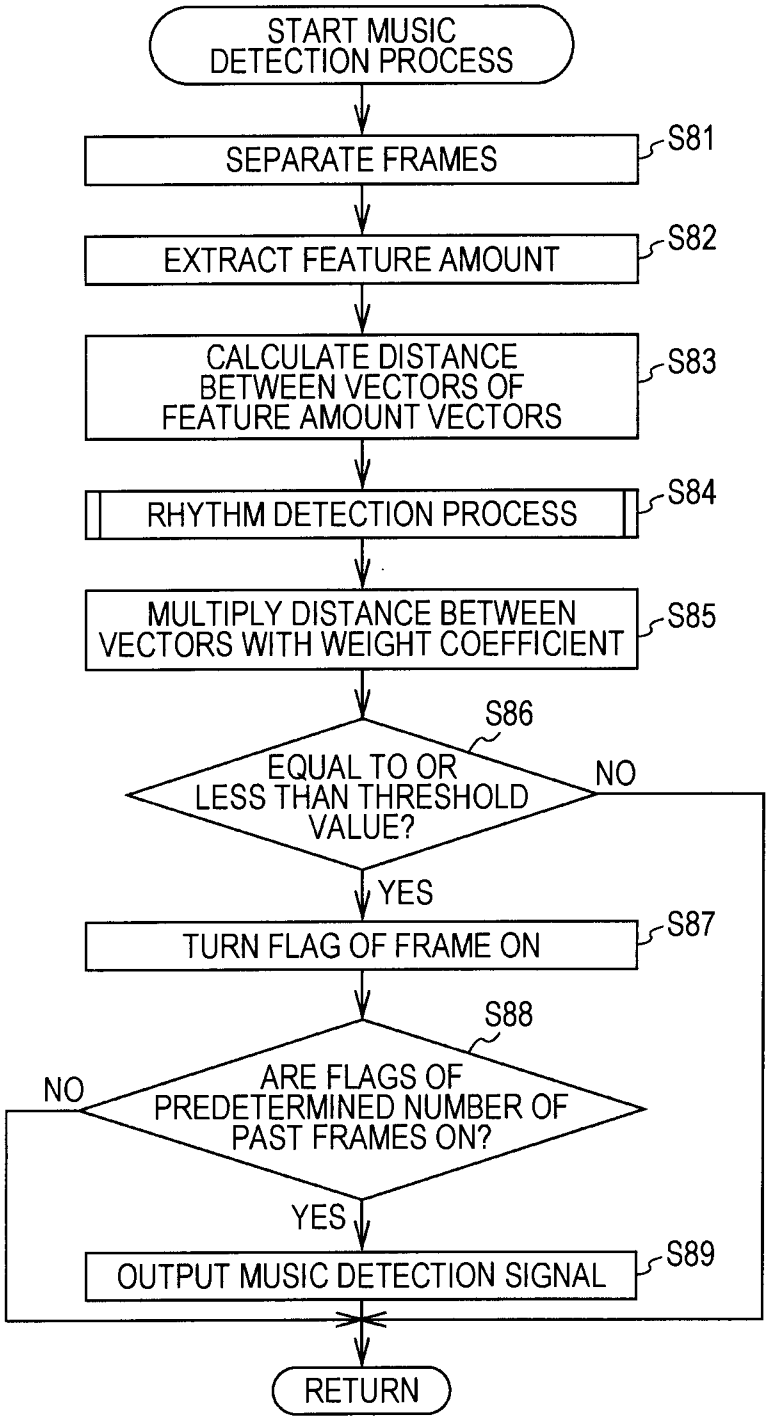
FIG. 15 is a flowchart that describes a different example of the music detection process.

Since step S81 to step S83 of FIG. 15 are respectively the same as the processes as step S41 to step S43 of FIG. 7, detailed description thereof will be omitted.

Figure 16:
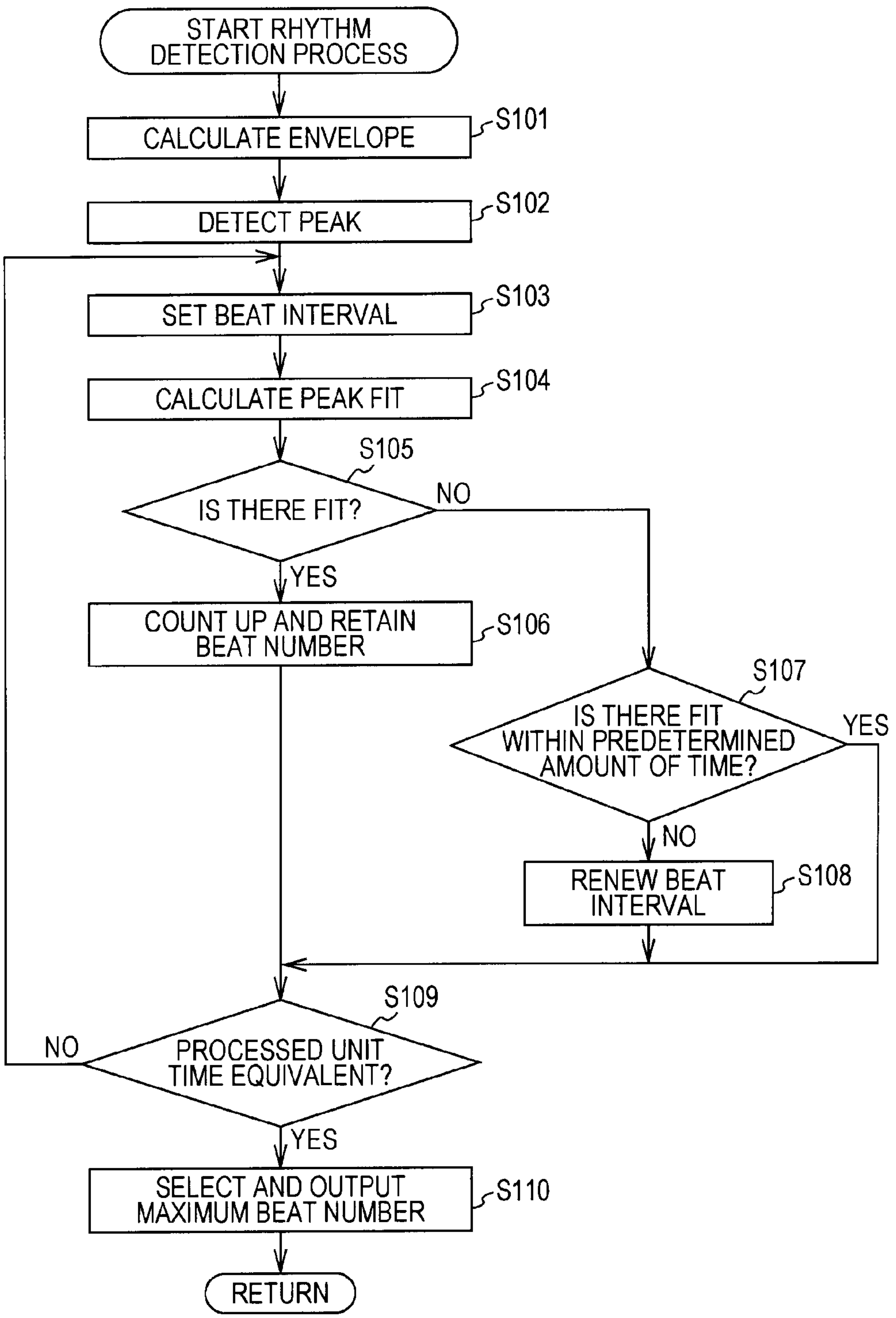
FIG. 16 is a flowchart that describes an example of a rhythm detection process.

In step S84, the rhythm detection unit 84 executes a rhythm detection process that will be described later with reference to FIG. 16. Detection of the rhythm in the sounds of the surroundings is thus performed.

In step S85, the identification unit 83 sets a weighting coefficient that corresponds to the beat number that is output along with the processing of step S84, and multiplies the intervector distance that calculated in the processing of step S83 with the weighting coefficient. At this time, for example, as described above with reference to FIGS. 12 and 13, the weighting coefficient is set and multiplied by the intervector distance.

Since the processes of step S86 to step S89 of FIG. 15 are the same as the processes of step S44 to step S47 of FIG. 7, detailed description thereof will be omitted.

Next, a detailed example of the rhythm detection process of step S84 of FIG. 15 will be described with reference to FIG. 16.

In step S101, the envelope calculation unit 121 calculates an envelope based on the waveform of a frame separated signal that is output from the frame separation unit 81. In so doing, the envelope shown in the region 92 of FIG. 9, for example, is obtained.

In step S102, the peak detection unit 122 detects the peaks of the waveform based on the envelope that is calculated by the processing of step S101. In so doing, the peak positions shown in the region 93 of FIG. 9, for example, is obtained. The detection results of the peak detection unit 122 are supplied to the tracker 131-1, the tracker 131-2, . . . . Accordingly, the processes of step S103 to step S109 are processes that are executed concurrently with the respective trackers.

In step S103, the beat interval setting unit 151 sets the beat interval as, for example, the bar 101-1, the bar 101-2, . . . described above with reference to FIG. 9.

In step S104, the peak fit calculation unit 152 calculates the peak fit based on the difference in terms of time, for example, between the beat positions and the peak positions.

In step S105, the peak fit calculation unit 152 determines whether or not the peak positions match the beat positions by, for example, determining the threshold value of the peak fit that is calculated in the processing of step S104.

In a case when it is determined that there is a match in step S105, the processing proceeds to step S106.

In step S106, the beat number retaining unit 154 counts up and retains the beat number.

On the other hand, in a case when it determined in step S105 that there is no match, the processing proceeds to step S107.

In step S107, the beat interval update unit 153 determines whether or not beats that match the peaks are detected within, for example, a predetermined amount of time.

In a case when it is determined in step S107 that beats that match the peaks are not detected within a predetermined amount of time, the processing proceeds to step S108.

In step S108, the beat interval update unit 153 newly sets (updates) a beat interval. The beat interval is updated by changing the tempo, the melody, or the like, for example. Here, at this time, the beat number that is retained by the beat number retaining unit 154 is cleared.

On the other hand, in a case when it is determined in step S107 that beats that match the peaks are detected within the predetermined amount of time, the processing of step S108 is skipped.

In a case when it is determined in step S107 that beats that match the peaks are detected within the predetermined time, after the processing of step S108, or after the processing of step S106, the processing proceeds to step S109.

In step S109, it is determined whether or not frames for the unit time have been processed, and in a case when it is determined that the frames for the unit time have not been processed, the processing returns to step S103 and the processes thereafter are executed again.

On the other hand, in a case when it is determined in step S109 that the frames for the unit time have been processed, the processing proceeds to step S110. In step S110, the selection unit 123 selects and outputs the greatest out of the respective beat numbers that are retained by the processing of step S106 by the tracker 131-1, the tracker 131-2, . . . .

The rhythm detection process is thus executed.

Here, the series of processes described above may be executed by hardware or may be executed by software. In a case when the series of processes described above is executed by software, a program that configures the software is installed on a computer that is built into dedicated hardware from a network or a recording medium. Further, the program is installed, for example, on a general-purpose personal computer 700 that is able to execute various types of functions by installing various types of programs as illustrated in FIG. 17.

Figure 17:
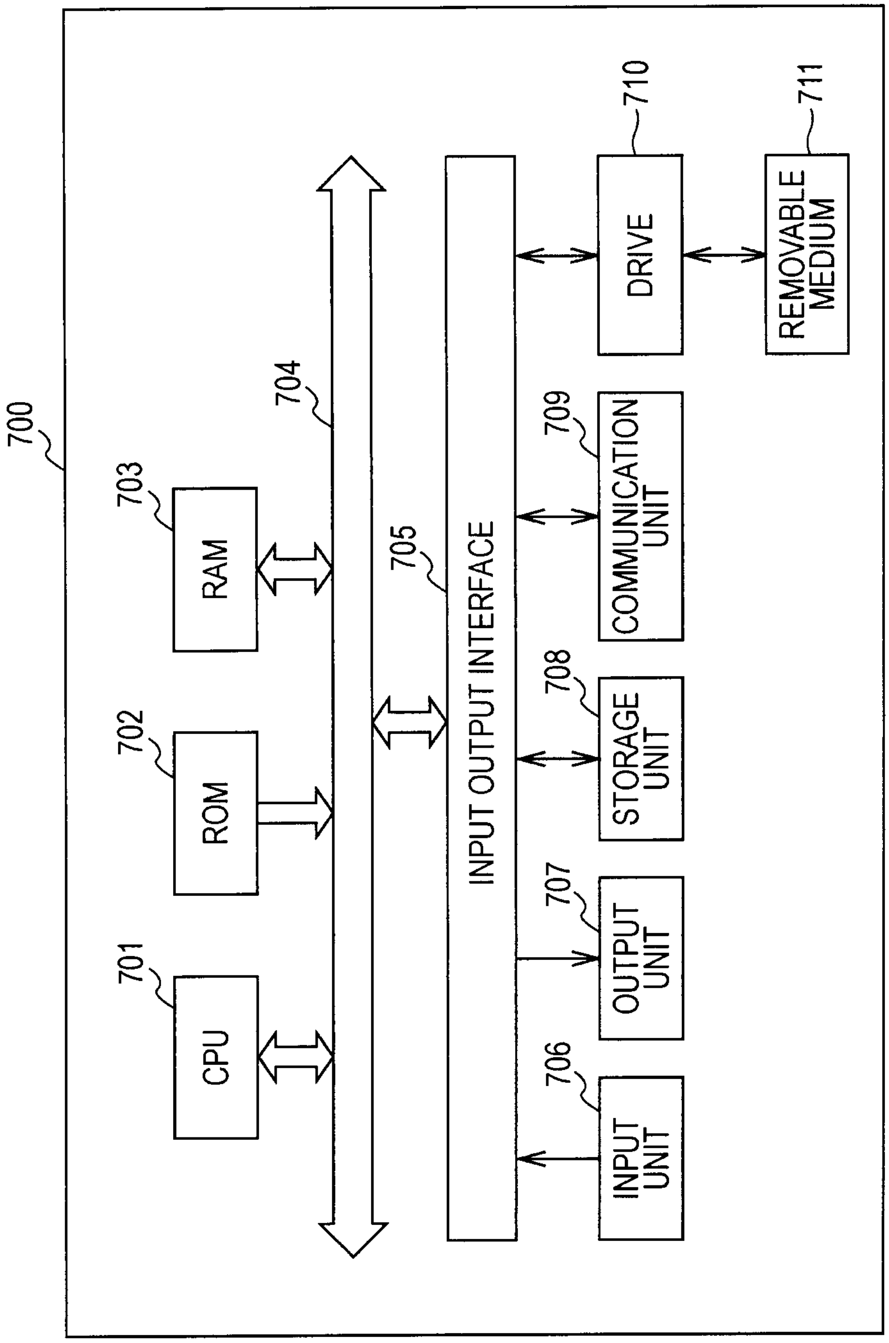
FIG. 17 is a block diagram that illustrates a configuration example of a personal computer.

In FIG. 17, a CPU (Central Processing Unit) 701 executes various types of processes according to a program that is stored on a ROM (Read Only Memory) 702 or a program that is loaded from a RAM (Random Access Memory) 703 from a storage unit 708. Data that is used for the CPU 701 to execute the various types of processes or the like is also stored as appropriate in the RAM 703.

The CPU 701, the ROM 702, and the RAM 703 are connected to one another via a bus 704. An input output interface 705 is further connected to the bus 704.

An input unit 706 composed on a keyboard, a mouse, and the like, a display composed of an LCD (Liquid Crystal Display), and an output unit 707 composed of speakers or the like are connected to the input output interface 705. Further, a storage unit 708 that is configured by a hard disk or the like and a communication 709 that is configured by a modem, a network interface such as a LAN card, or the like are connected to the input output interface 705. The communication unit 709 performs a communication process via a network including the Internet.

Further, a drive 710 is connected and a removable medium 711 such as a magnetic disk, an optical disc, a magneto-optical disc, or a semiconductor memory is fitted as appropriate to the input output interface 705. Furthermore, a computer program that is read from such removable media is installed on the storage unit 708 as necessary.

In a case when the series of processes described above is executed by software, a program that configures the software is installed from a network such as the Internet or a recording medium composed of a removable medium 711 or the like.

Here, such a recording medium may be configured not only by the removable medium 711 that is composed of a magnetic disk (including floppy disks (registered trademark)), an optical disc (including CD-ROMs (Compact Disc-Read Only Memory) and DVDs (Digital Versatile Disc)), a magneto-optical disc (including MDs (Mini-Discs) (registered trademark)), a semiconductor memory, or the like illustrated in FIG. 17 which is distributed in order to transmit a program to the user separately from the device main body, but also includes a recording medium that is configured by the ROM 702 on which a program is recorded, a hard disk that is included in the storage unit 708, or the like which is transmitted to the user in a state of being built into the device main body in advance.

Here, the series of processes described above in the specification includes not only processes that are performed in time series along the order described, but also processes that are executed in parallel or individually without necessarily being processed in time series.

Further, the embodiments of the disclosure are not limited to the embodiments described above, and various modifications are possible within a range that does not depart from the scope of the disclosure.

The present disclosure contains subject matter related to that disclosed in Japanese Priority Patent Application JP 2010-284367 filed in the Japan Patent Office on Dec. 21, 2010, the entire contents of which are hereby incorporated by reference.

What is claimed is:

1. A content reproduction device comprising:

a microphone that collects noise in surroundings of a casing;

a feature amount extractor that extracts a plurality of feature amounts that are obtained from a waveform of a signal of sounds collected by the microphone as a feature amount vector;

a distance calculator that calculates an intervector distance between the extracted feature amount vector and a feature amount vector of same dimensions which is set in advance as a feature amount of a waveform of a music signal;

a determinator that determines whether or not music is included in sounds collected by the microphone by determining a threshold value of the calculated distance;

a processor that processes a signal of sounds collected by the microphone to change a volume or frequency characteristics of sounds collected by the microphone in a case when it is determined by the determinator that music is included in sounds collected by the microphone; and an adder that adds and outputs a signal of sounds collected by the microphone and a signal of sounds of reproduced content.

2. The content reproduction device according to claim 1, wherein the feature amount extractor separates a waveform of a signal of sounds collected by the microphone into frames with predetermined lengths in terms of time, the determinator further determines whether or not music is included in sounds collected by the microphone in the plurality of frames that are set in advance, and the processor processes a signal of sounds collected by the microphone in a case when it is determined by the determinator that music is included in sounds collected by the microphone in the plurality of frames that are set in advance.

3. The content reproduction device according to claim 1, further comprising:

a rhythm detector that detects a rhythm of sounds collected by the microphone, wherein the detector weights the calculated intervector distance based on a detection result of the rhythm detector.

4. The content reproduction device according to claim 1, further comprising:

another processor that processes a signal of sounds of reproduced content to change a volume or frequency characteristics of sounds of the reproduced content in a case when it is determined by the determinator that music is included in sounds collected by the microphone.

5. The content reproduction device according to claim 3, wherein the rhythm detector detects a peak of a waveform of a signal of sounds collected by the microphone, calculates a fit between a position of the detected peak in terms of time and a position of a beat in terms of time in a beat interval that is set in advance, and determines whether or not the beat and the peak match, and retains a number of the beats that match the peak within a unit time.

6. The content reproduction device according to claim 5, wherein the rhythm detector determines whether or not the beat and the peak match within a predetermined amount of time that is shorter than the unit time, and updates the beat interval based on the determination result.

7. The content reproduction device according to claim 5, further comprising:

a weighting controller that sets and multiplies a weighting coefficient according to the number of beats that match the peak for each unit time by the intervector distance that is calculated by the distance calculator.

8. The content reproduction device according to claim 7, wherein while it is determined by the determinator that music is included in sounds collected by the microphone until it is determined that music is not included, the weighting controller changes a value of a weighting coefficient according to the number of beats.

9. A content reproduction method comprising:

collecting noise by a microphone in surroundings of a casing;

extracting by a feature amount extractor a plurality of feature amounts that are obtained from a waveform of a signal of sounds collected by the microphone as a feature amount vector;

calculating by a distance calculator an intervector distance between the extracted feature amount vector and a feature amount vector of same dimensions which is set in advance as a feature amount of a waveform of a music signal;

determining by a determinator whether or not music is included in sounds collected by the microphone by determining a threshold value of the calculated distance;

processing by a processor a signal of sounds collected by the microphone to change a volume or frequency characteristics of sounds collected by the microphone in a case when it is determined by the determinator that music is included in sounds collected by the microphone; and adding and outputting by an adder a signal of sounds collected by the microphone and a signal of sounds of reproduced content.

10. A non-transitory computer readable storage medium having stored thereon, a computer program having at least one code section executable by a computer, thereby causing the computer to perform the steps comprising:

a plurality of feature amounts that are obtained from a waveform of a signal of sounds collected by a microphone as a feature amount vector;

calculating an intervector distance between the extracted feature amount vector and a feature amount vector of same dimensions which is set in advance as a feature amount of a waveform of a music signal;

determining whether or not music is included in sounds collected by the microphone by determining a threshold value of the calculated distance;

processing a signal of sounds collected by the microphone to change a volume or frequency characteristics of sounds collected by the microphone in a case when it is determined that music is included in sounds collected by the microphone; and for adding and outputting a signal of sounds collected by the microphone and a signal of sounds of reproduced content.

* * * * *